United States Patent [19]

Schroeder et al.

[11] Patent Number: 5,283,948
[45] Date of Patent: Feb. 8, 1994

[54] METHOD OF MANUFACTURING INTERCONNECT BUMPS

[75] Inventors: Paul E. Schroeder, Chippewa Falls; Deanna M. Dowdle, Bloomer, both of Wis.

[73] Assignee: Cray Research, Inc., Eagan, Minn.

[21] Appl. No.: 708,447

[22] Filed: May 31, 1991

[51] Int. Cl.⁵ .................... H01R 9/09; H01K 3/10
[52] U.S. Cl. .................................. 29/843; 29/852
[58] Field of Search ............ 29/842, 843, 846, 852; 174/259, 260, 263, 267

[56] References Cited

U.S. PATENT DOCUMENTS

| | | | |
|---|---|---|---|
| 3,266,127 | 8/1966 | Harding et al. | 29/843 |
| 3,986,255 | 10/1976 | Mandal | 29/843 |
| 4,107,836 | 8/1978 | Roberts. | |
| 4,179,802 | 12/1979 | Joshi et al. | 29/843 |
| 4,223,435 | 9/1980 | Roberts. | |
| 4,263,606 | 4/1981 | Yorikane. | |
| 4,357,750 | 11/1982 | Ostman. | |
| 4,740,867 | 4/1988 | Roberts. | |
| 4,824,379 | 4/1989 | Roberts. | |
| 4,893,404 | 1/1990 | Shirahata et al. | 29/846 |
| 4,961,259 | 10/1990 | Schreiber | 29/852 |

Primary Examiner—P. W. Echols
Assistant Examiner—David P. Bryant
Attorney, Agent, or Firm—Merchant, Gould, Smith, Edell, Welter & Schmidt

[57] ABSTRACT

A method of manufacturing interconnect bumps on electrical connectors is disclosed. The interconnect bumps are formed with mechanically interlocking structure which allows the bumps to reach a height substantially greater than prior art bumps, while remaining structurally intact. The interconnect bumps are formed using standard photolithography techniques to form the bumps in multiple interlocking portions to achieve a structurally superior interconnect bump.

1 Claim, 2 Drawing Sheets

PRIOR ART

METHOD OF MANUFACTURING INTERCONNECT BUMPS

TECHNICAL FIELD OF THE INVENTION

An apparatus and method of manufacturing interconnect bumps on electrical connectors is disclosed. More particularly, the interconnect bumps are formed with a mechanically interlocking structure allowing the bumps to reach a height substantially greater than those previously formed through known processes.

BACKGROUND OF THE INVENTION

Interconnect bumps are used primarily to make electrical connections between connectors and circuit boards. The interconnect bumps make electrical contact above the connector or board with another electrical component which could be either another connector or a circuit board. In a connector employing a densely-packed interconnect pattern the height of interconnect bumps is critical to avoid cross-talk and other unwanted electrical phenomenon associated with such patterns on electrical connectors.

The standard process to form interconnect bumps is an additive process in which the circuit traces and bumps are formed by depositing successive layers of metal on a suitable substrate by electrodeposition, sputtering, vapor deposition or other known processes. Bumps formed by this additive process are typically 0.001 to 0.0015 inches ($2.54 \times 10^{-5}$ to $3.81 \times 10^{-5}$ meters) high and do not have any mechanical anchoring or support features other than adhesion between the layers.

The lack of height makes connectors employing such bumps in densely-packed interconnect patterns subject to cross-talk and other unwanted electrical phenomenon. The height is limited primarily by the structure of the bumps themselves, as well as the processes used to form the interconnect bumps. Attempts to form higher bumps results in bumps which delaminate or "slide" off their base structures. Once the bumps delaminate, the connectors fail to make electrical connection between their associated components.

Prior art processes used to form interconnect bumps also include etching a single layer or series of layers which were previously built up on an electrical component. Such a method is described in U.S. Pat. No. 4,357,750 to Ostman, issued Nov. 9, 1982. These methods typically start with a very thick layer of copper and use standard photolithographic methods to define the desired pattern. Typically an ammoniacal etchant is used to etch away undesired copper to form the pattern. The disadvantages to this process are the high cost of depositing a large amount of copper and then removing it in a process from which the copper may or may not be recovered. In addition, the thick electrodeposited copper base material is not suitable for dynamic flex circuit applications because it lacks flexibility, it is difficult to form bumps with straight side walls because of the etching process, and the process is not well-suited for the fabrication of highly complex, very high density printed circuits.

To solve the above-mentioned problems and others not mentioned, the present method and apparatus provide a stable, reliable interconnect bump for use on connectors having high density interconnect patterns.

SUMMARY OF THE INVENTION

The present invention describes a bump and method of manufacturing the bump. The preferred embodiment and method employ a semi-additive process in which the circuit features are also defined by standard photolithographic methods. The support means and traces are formed on a very thin layer of base copper which has a thin gold plating to protect them during the final etching. The bump itself is plated within a cavity in the support means as well as on top of the support means. The resulting bump structure ensures good copper-to-copper adhesion and mechanical stability through the interlocking mechanism of the bump which are not present in the standard bumps and methods of manufacture.

The preferred apparatus and method includes forming interconnect bumps on an electrically conductive base layer to make electrical connection between the base layer and a point elevated above that layer. The interconnect bump includes a support mechanism on the base layer to support the upward projection of the interconnect bump, with the preferred embodiment of the support mechanism having a cavity formed in the top surface of the support mechanism and the elevated connection bump being adapted to cooperate with the cavity in that support mechanism to support the elevated connection bump.

The cavity of the preferred embodiment of the interconnect bump preferably extends through the top surface of the support mechanism and exposes a copper base layer below that support mechanism. In the preferred embodiment, the cavity is also substantially cylindrical within the support mechanism with the cylinder disposed substantially perpendicular to the plane of the base layer. The cross-section of the cylindrical cavity is preferably substantially elliptical.

The preferred method of forming the elevated interconnect bump comprises the steps of depositing a layer of material on the base layer to form support means for providing support to maintain the interconnect bump substantially perpendicular to a plane defined by the base layer; and depositing a second layer of conductive material on the interconnect bump to form elevated connection means for making electrical connection at the point elevated above the base layer, said elevated connection means adapted to cooperate with said support means to maintain said elevated connection means in a position substantially perpendicular to the base layer plane.

In the preferred embodiment, the first and second layers of material are formed primarily of copper. In addition, the preferred method also includes the use of photolithography to form patterns into which the first and second layers of copper are electrolytically deposited in the desired shape and pattern to form the preferred interconnect bump. The bumps are then preferably made planar by abrading them down to the specified height. In the preferred method this height is determined by the thickness of the photoresist material used in forming the bumps.

Also in the preferred method and apparatus, a thin layer of gold is deposited on the support means before the second layer of copper is deposited on that support means. Likewise, the preferred interconnect bump includes a layer of nickel deposited on a top surface of the elevated connection means to form a barrier layer with a gold layer deposited on the nickel layer to aid in conductivity and longevity of the bump.

BRIEF DESCRIPTION OF THE DRAWING

Having briefly discussed the invention, it will be better understood from the detailed discussion of the invention that follows taken in conjunction with the attached drawing, wherein.

DETAILED DESCRIPTION OF THE PREFERRED EMBODIMENT

Figure 1:
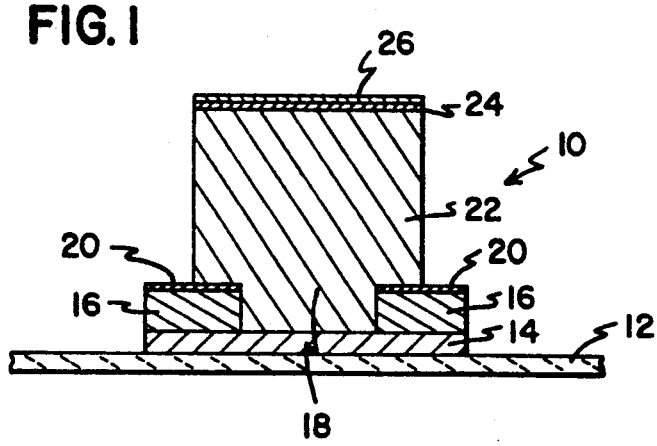
FIG. 1 is a cross-sectional view of the preferred embodiment of the interconnect bump along the line 1—1 of FIG. 2.

In the following detailed description of the preferred embodiment, reference is made to the accompanying drawing which forms a part hereof, and in which is shown by way of illustration specific embodiments in which the invention may be practiced. It is to be understood that other embodiments may be utilized and structural changes may be made without departing from the scope of the present invention.

The interconnect bump illustrated in the accompanying drawing is intended for use in flexible connection strips to connect high density circuit boards in high speed electronic equipment such as supercomputers of the type manufactured by Cray Research, Inc., the assignee of the present invention. Very fast supercomputers rely on high density packaging techniques to place active semiconductor circuits and circuit boards in close proximity to each other. The speed of such equipment depends, in part, on the distance between such circuit boards as well as the number of interconnections between each circuit board for carrying electronic data.

The interconnect bumps of the preferred embodiment are preferably used with flexible circuit connectors and circuit boards having a high contact density. The height of each connection point allows a higher density of contact points while reducing the problems of cross-talk and other electrical communication disturbances which would hinder the effectiveness of the electronic devices using the interconnect bumps at such a high density.

Interconnect Bump Structure

The bump 10, as shown in cross-section in FIG. 1 will be described first, with the preferred process used to form the bump described later.

The interconnect bump 10 of the preferred embodiment is formed on a substrate 12 comprised of a dielectric material. The substrate 12 of the preferred embodiment is primarily a polyimide material, with the trade-name of Upilex ®. In the preferred embodiment, the interconnect bumps 10 of the preferred invention are preferably formed on flexible circuits used to interconnect a number of circuit boards or other electric components. In that configuration, the interconnect bumps 10 are formed in arrays of 260 bumps having 26 columns and 10 rows with the spacing described above (0.020 and 0.040 inch centers). By placing the interconnect bumps 10 on connectors rather than on the boards, failure of one of the interconnect bumps 10 is not as critical or as costly, as the connector can be more easily and economically replaced than a circuit board. Also in the preferred embodiment, the substrate 12 of the flexible connector is preferably a material such as Kapton ®, Upilex ® or another organic, dielectric film. This material is both insulating and flexible as required by a connector. It will be appreciated, however, that the bump 10 could be formed on any suitable surface comprised of a variety of materials, dielectric or conductive as desired.

The base layer 14 of the preferred embodiment is located on the substrate 12 and the support means 16 is shown located on the base layer 14. In the preferred embodiment, both the base layer 14 and the support means 16 are formed of copper. The top surface of the support means 16 is preferably coated with a thin layer of gold 20 as required in the process of forming the bump (described in greater detail below). It will be appreciated that the thin layer 20 could be comprised of any of a number of materials, the primary purpose of the layer 20 being to coat the surface of the support means 16 to prevent oxidation and degradation of the material comprising the support means 16 during the processing of the bump 10 as well as during use. Elevated connection point 22 of the preferred embodiment sits above and within the support means 16 as shown in FIGS. 1 & 2. FIG. 2 may be referenced to fully understand the mechanical interlocking structure between the elevated connection point 22 and the support means 16. The preferred material of the elevated point 22 is copper. In the preferred embodiment, the elevated connection point 22 is planarized and coated with a thin barrier layer 24 of nickel which is, in turn, coated with a layer 26 of gold to increase conductivity of the bump 10 as well as to allow gold-to-gold connections.

The sandwich of layers 24 and 26 prevents mechanical and chemical degradation of the upper surface of the interconnect bump 10 during repeated use of the interconnect bump 10 in which it is forced into contact with connection pads and other surfaces, subjecting it to forces which could exceed 125 grams per contact point (bump). During such use, the barrier layer 24 prevents the gold layer 26 from migrating into the copper of the preferred elevated connection point 22.

Although the above structures are preferably comprised of copper, those skilled in the art will recognize that other metals could be used. In particular, the support means could be formed of a nonconductive material because electrical connection could be made between the elevated connection point 22 and base layer 14, both formed of copper in the preferred embodiment and the primary purpose of the support means 16 is to provide support. In addition, the layers 20, 24 and 26 will also be recognized as being comprised of any number of suitable metals recognizable to those skilled in the art.

Figure 2:
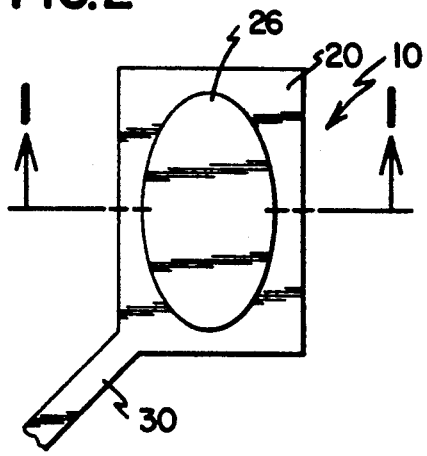
FIG. 2 is a top view of the interconnect bump located on a mounting pad attached to a conductive trace.

As shown in FIGS. 1 & 2, the support means 16 and base layer 14 of the preferred embodiment are electrically and mechanically interconnected to a trace 30 which is used to connect the interconnect bump 10 to other components. The trace 30 is preferably comprised of copper with a layer of gold on its top surface deposited as part of the forming process (further described below). Those skilled in the art will recognize that a variety of other metals could be used to form the layers of the trace 30 or that a single metal layer could be used to comprise the entire trace with no layering required.

In the preferred embodiment, the interconnect bump 10, when viewed from the top as in FIG. 2 and in cross-section in FIG. 1, has a base layer 14, support means 16 and gold layer 20 which measure approximately 0.014 inches by 0.006 inches. The substantially elliptical elevated connection point 22 and layers 24 and 26 have major and minor axes which preferably are approximately 0.006 and 0.004 inches, respectively. Referring to FIG. 1, the height of the base layer 14, support means 16 and gold layer 20 is preferably approximately 0.0007 inches. The height of the elevated connection point 22, nickel layer 24, and gold layer 26 above the layer 20 on the support means 16 is preferably approximately 0.003 inches, which results in a 4:1 ratio of the height of the elevated connection point 22 above the top surface of the support means 16 to the height of the support means 16 above the substrate 12. The resulting preferred bump 10 extends a total of approximately 0.0037 inches above the substrate 12.

The trace 30 of the preferred embodiment bump 10 preferably has a width of approximately 0.002 inches and the bumps 10 of the preferred embodiment are preferably spaced in rectangular arrays of 260 bumps on centers approximately 0.020 inches apart in one direction and 0.040 inches apart in the perpendicular direction. The preferred bumps 10 in a given array have top layers 26 which are preferably planar to within ±0.0002 inches.

Figure 3:
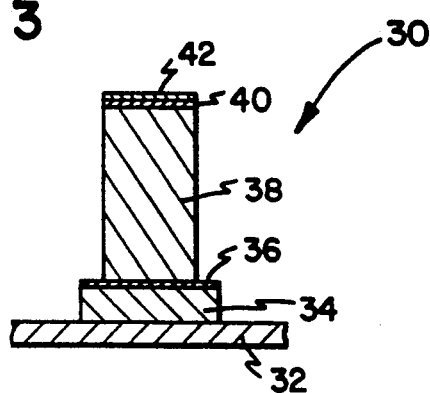
FIG. 3 is a cross-sectional view of a prior art interconnect bump.

As discussed in the background section, prior art interconnect bumps are limited to heights of 0.001 to 0.0015 inches. Thus, the preferred embodiment of the present invention allows for an interconnect bump 10 which is approximately at least two times the height of earlier interconnect bumps. FIG. 3 depicts a prior art elevated interconnect bump 30. The construction of this bump 30 is similar to the present invention, with the bump 30 having a base layer 32; support layer 34 coated with a top surface layer 36, usually gold; and an elevated connection point 38 located on the support layer 34 which is, in turn, coated with a barrier layer 40 and a final top layer 42. The relative instability of the prior art interconnect bump 30 as compared to the interconnect bump 10 of the present invention is apparent on comparison of the cross-section of the two bumps.

Referring to FIG. 1, the interconnect bump 10 of the present invention is formed to allow for a mechanically interlocking connection between the support means 16 and the elevated connection point 22. The mechanical interlock occurs at the interface between the elevated connection point 22 and the support means 16, where the elevated interconnection point 22 has a lower portion which fits into cavity 18 in the support means 16.

The support means 34 and elevated connection point 38 of the prior art interconnect bump 30, however, have no such mechanically interlocking structure to support the elevated connection point 38. As a result, the interconnect bump 38 of the prior art interconnect bump 30 is easily dislodged from the support layer 34, causing the bump 30 to fail to make adequate connection. In contrast, the elevated connection point 22 of the preferred embodiment of the interconnect bump 10 is very resistant to being dislodged from its support means 16 because of the mechanically interlocking structure described above.

An additional advantage of the present invention over the prior art is that without the support means cavity 18, copper layer 22 would be plated on gold layer 20 which would raise an adhesion problem as plated copper does not adhere as well to gold as it does to copper. As a result, the preferred embodiment provides increased adhesion between the copper bump 22 and copper base layer 14 in addition to the mechanically interlocking structure described above.

Figure 4:
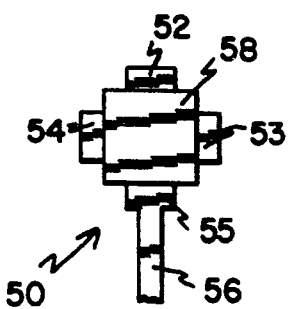
FIG. 4 is a top view of a pad with connected trace and an alternate embodiment of the interconnect bump as shown.

A top view of an alternate preferred embodiment of the interconnect bump of the present invention is depicted in FIG. 4. The interconnection point 58 of that embodiment of the interconnect bump 50 is shown as being surrounded by support sections 52, 53, 54, 55 which prevent the interconnection point 58 from being dislodged from the connector. Support section 55 is also shown with a protruding trace 56 for connection of the interconnect bump 50 to other parts of this connector and/or other electrical components. This alternate embodiment would preferably be comprised primarily of copper with appropriate layers of gold and nickel as described above with respect to the preferred embodiment. Other variations of the invention could include support means 16 formed with a plurality of cavities to provide interlocking structure for the elevated connection point 22.

Although the preferred embodiments are comprised primarily of copper with appropriate layers of nickel and gold, those skilled in the art will recognize that other metals or materials could be used in place of those disclosed. In addition, those skilled in the art will also appreciate that additional alternate embodiments of the interconnect bump could exist in a variety of shapes and combinations which would provide the necessary support and resistance to dislodgement of the preferred embodiments described above.

PREFERRED METHOD

The preferred interconnect bump 10 is created using standard photolithographic techniques well known to those skilled in the art. As such, the process will only be generally described below. In the preferred method, the base layer 14 is preferably approximately 9 microns thick. Those skilled in the art will recognize that other metals could also be used in place of copper to form the base layer 14.

The base layer 14 is cleaned to prevent contamination and increase adhesion of the photoresist layer 62, which is preferably negative acting dry film photoresist laminated over the base layer 14 to a thickness of approximately 0.001 inches. The photoresist layer 62 is then covered with a photo-lithography mask (not shown) defining the shape of the support means 16 as well as the traces 30. The photoresist layer 62 is exposed by the appropriate radiation after which the mask is removed and the latent image is chemically developed. The unexposed sections of the photoresist layer 62 are chemically removed from the base layer 14 to expose areas selected by the mask.

Figure 5:
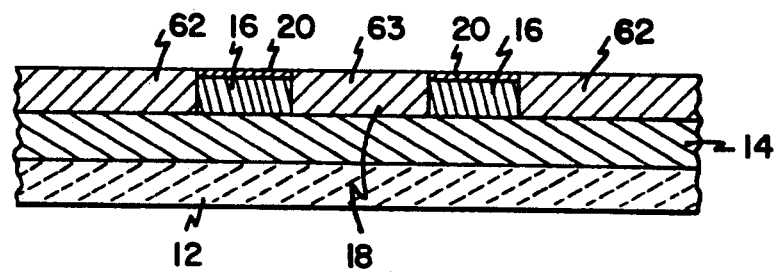
FIG. 5 is a cross-sectional view of the interconnect bump after the copper and gold layers of the support means of the preferred embodiment have been deposited on the base layer and the photoresist material has not been removed.

A cross-section of the preferred interconnect bump 10 during the first phases of this process is shown in FIG. 5. The photoresist layer 62 is shown surrounding the support means 16 with the photoresist material 63 remaining in the cavity 18 of the support means 16 to define the cavity 18 which cooperates with the elevated connection point 22 of the interconnect bump 10, as shown in FIG. 1. After the photoresist layer 62,63 has been formed in the appropriate pattern, the support means 16 is electrolytically deposited on the base layer 14 in the pattern formed by the photoresist material 62, 63 as shown in FIG. 5. In the preferred embodiment, the metal of the support means 16 is copper, although it will be understood by those skilled in the art that other materials or metals could be substituted in place of copper. In order to protect the copper support means 16 from oxidation and degradation during the processing, as well as to provide a suitable bond between the support means 16 and the elevated connection point 22, the support means 16 is electrolytically flash plated with a thin layer 20, preferably of gold. In addition to flash plating the support means 16, the traces 30 (shown in FIG. 2) of the interconnect bump are also plated with a thin layer 20 of gold at the same time. This thin gold layer 20 will act as an etch resist to protect the traces 30 and support means 16 during later processing.

The base layer 14, support means 16 and thin layer 20 extend approximately 0.0007 inches above the substrate 12. After flash plating the remaining support sections 16 with the thin layer 20 of gold, the remaining photoresist material 62, 63 is removed and the panel is cleaned to prevent contamination and increase adhesion of the next layers.

Figure 6:
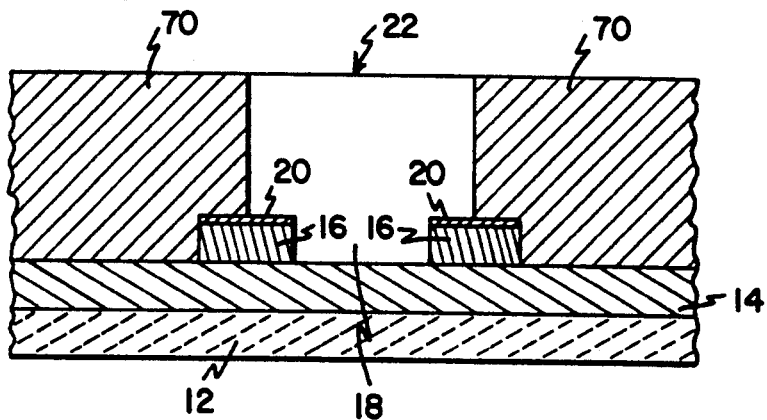
FIG. 6 is a cross-sectional view of the preferred embodiment of the interconnect bump directly prior to coating of the base layer and support means with the copper forming the elevated interconnect bump.

At that point, a second photoresist layer 70, preferably a thicker negative acting dry film photoresist, is laminated on the support means 16 with its thin layer 20 and the exposed surrounding base layer 14. As opposed to the first layer of photoresist 62, which is preferably only approximately 0.001 inches thick, this second layer of photoresist 70 is preferably approximately 0.003 inches thick. As before, the photoresist layer 70 is then covered with a photolithography mask (not shown) defining the desired pattern and then the photoresist material is exposed by the appropriate radiation after which the mask is removed and the latent image is chemically developed. The photoresist layer 70 is then removed from the interconnect bump area to expose selected areas which define the elevated connection points 22. A cross-section of the interconnect bump at that point in the process is seen in FIG. 6. The photoresist layer 70 is shown as surrounding the outer portions of the support means 16 and providing a form for deposition of the elevated connection point 22 of the interconnect bump 10 as shown in FIG. 1.

Prior to electrolytically depositing the elevated connection points 22 in the cavities formed for them, the area is cleaned again to prevent contamination and increase adhesion of the elevated connection points 22 to the base layer 14 and the support means 16. To help control the height and, thus, the planarity of the elevated connection points 22, thieve strips are placed in appropriate positions around the bumps to provide for uniform current distribution in the interconnect bump area. Those skilled in the art will understand the thieving process and its requirements without further explanation. After the material for the connection points 22 has been deposited in the support means 16 to a height slightly greater than the required final height, the bumps are planarized by abrading them down to the level of the photoresist material 70. The abrading process is preferably sanding, but it will be understood that a number of abrasion processes could be substituted.

After planarization, a barrier layer 24 is flash plated on the top surface of the preferred elevated connection point 22. Although nickel is the preferred metal for this barrier layer, it will be understood by those skilled in the art that other metals or materials could be substituted, or that no barrier layer may be required, depending on the intended use of the bump 10. After the nickel layer 24 is plated, a gold layer 26 is plated on top of the nickel layer 24. The gold is added to aid in electrical connection of the interconnect bump 10 to a variety of other surfaces while avoiding contamination and degradation due to oxidation. The barrier layer 24 prevents migration of the gold layer 26 into the copper of the interconnection point 22 during use. In the preferred embodiment, the gold layer 26 is preferably a soft gold (60–90 Knoop Hardness), 80 to 120 microinches thick.

After the metal plating of the preferred method is completed, the remaining photoresist material 70 is removed from the area surrounding the bumps. In the preferred method, the entire area is then etched with an alkaline solution to remove the copper of the base layer 14 between the traces 30 and support means 16. The alkaline solution does not attack the gold plated layers, thus leaving the traces 30 along with the interconnect bumps 10 relatively unaffected by the alkaline etching process. In that way the traces 30 and interconnect bumps 10 are formed to be electrically discontinuous with one another except where connected by traces 30. Such a chemical etching process is well known to those skilled in the art.

Those skilled in the art will also recognize that other processes of forming the interconnect bump 10 could be used alone or in combination, such as mechanical forming and/or chemical milling or etching. In addition, those skilled in the art will also recognize that positive or negative photoresist and mask combinations may be used to form the desired patterns as described above. Those skilled in the art will also recognize that deposition techniques other than electrolytic plating could be used to deposit the layers of the interconnect bump and trace, including, but not limited to, sputtering or vapor deposition.

Although specific embodiments and methods of the present invention have been illustrated and described herein, it will be appreciated by those of ordinary skill in the art that any arrangement which is calculated to achieve the same purpose may be substituted for the specific embodiments shown. For example, the present invention disclosed herein may be implemented with different substrates or metals. In addition, different processing steps or metallized patterns than those disclosed in the detailed description could be used. This application is also intended to cover any adaptations or variations of the present invention. One such variation would be to use the interconnect bumps of the present invention on circuit boards or other electrically connected components than those described herein. Thus, it is manifestly intended that this invention be limited only by the claims and the equivalence thereof.

We claim:

1. A method of coating a base layer to form an electrically conductive interconnect bump having elevated connection means rising above support means, the elevated connection means for making electrical connection between a point elevated above the base layer and the base layer and the support means for providing a mechanical interlock with the elevated connection means to prevent displacement of the elevated connection means comprising the steps of:

coating the base layer with a photoresist layer;

exposing the photoresist layer to radiation in a pattern defining the shape of the support means and an interlock cavity in the support means;

removing the photoresist layer to form a first cavity in the photoresist layer defining the shape of the support means and the interlock cavity in the support means, the first cavity exposing a portion of the base layer;

depositing a first layer of conductive material on the base layer in the first cavity formed in the photoresist layer, said first layer of conductive material forming the support means and interlock cavity;

depositing a layer of gold on the support means;

coating the base layer and support means with a second photoresist layer;

exposing the second photoresist layer to radiation in a pattern defining the shape of the elevated connection means;

removing the photoresist layer in the pattern defining the shape of the elevated connection means to form a second cavity in the second photoresist layer in the shape of the elevated connection means, the second cavity exposing the interlock cavity in the support means and a portion of the support means;

depositing a second layer of conductive material in the interlock cavity in the support means and on the exposed portion of the support means in the pattern defined by the second layer of photoresist material to form the elevated connection means;

planarizing a top surface of the elevated connection means of the interconnect bump;

depositing a layer of gold on the top surface of the elevated connection means; and removing the remaining second photoresist layer.

* * * * *